(12) United States Patent
Kim

(10) Patent No.: US 7,547,940 B2
(45) Date of Patent: Jun. 16, 2009

(54) NON-VOLATILE MEMORY DEVICES SUITABLE FOR LCD DRIVER APPLICATIONS

(75) Inventor: Yong-hoon Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/623,829

(22) Filed: Jan. 17, 2007

(65) Prior Publication Data

US 2007/0164347 A1    Jul. 19, 2007

(30) Foreign Application Priority Data

Jan. 17, 2006    (KR) ................ 10-2006-0004879

(51) Int. Cl.
*H01L 29/788* (2006.01)
(52) U.S. Cl. .............. 257/315; 257/322; 257/320; 257/E21.209; 257/E21.662
(58) Field of Classification Search ............. 257/315, 257/322, 320, E21.209, E21.662
See application file for complete search history.

(56) References Cited

U.S. PATENT DOCUMENTS

2007/0148851 A1    6/2007    Kim et al.

FOREIGN PATENT DOCUMENTS

| JP | 06-338617 | 12/1994 |
|---|---|---|
| JP | 07-245352 | 9/1995 |
| KR | 1020000039304 A | 7/2000 |

*Primary Examiner*—Sue Purvis
*Assistant Examiner*—Tucker Wright
(74) *Attorney, Agent, or Firm*—Myers Bigel Sibley & Sajovec

(57) ABSTRACT

Non-volatile memory devices according to embodiments of the present invention include an EEPROM transistor in a first portion of a semiconductor substrate, an access transistor in a second portion of the semiconductor substrate and an erase transistor in a third portion of the semiconductor substrate. The second portion of the semiconductor substrate extends adjacent a first side of the first portion of the semiconductor substrate and the third portion of the semiconductor substrate extends adjacent a second side of the first portion of the semiconductor substrate. The first and second sides of the first portion of the semiconductor substrate may be opposite sides of the first portion of the semiconductor substrate. The access transistor has a first source/drain terminal electrically connected to a first source/drain terminal of the EEPROM transistor and the erase transistor has a first source/drain terminal electrically connected to a second source/drain terminal of the access transistor.

8 Claims, 3 Drawing Sheets

NON-VOLATILE MEMORY DEVICES SUITABLE FOR LCD DRIVER APPLICATIONS

REFERENCE TO PRIORITY APPLICATION

This U.S. non-provisional patent application claims priority under 35 U.S.C. § 119 to Korean Patent Application No. 2006-4879, filed Jan. 17, 2006, the entire contents of which are hereby incorporated herein by reference.

FIELD OF THE INVENTION

This invention relates to integrated circuit devices and, more particularly, to integrated circuit memory devices.

BACKGROUND OF THE INVENTION

Unlike in Dynamic Random Access Memories (DRAMs) and Static Random Access Memories (SRAMs), non-volatile memory devices can retain stored information when not powered. An example of a non-volatile memory device is an EEPROM device. EEPROM devices are electrically programmed in a similar manner to Erasable Programmable Read-Only Memories (EPROM), but unlike EPROMs, erasing can be performed selectively per unit cell using an electrical system.

Conventionally, EEPROM devices included can be included in mobile goods such as mobile phones and personal digital assistants (PDAs) together with a display unit. For example, an EEPROM device may be installed in an LDI (i.e., a device that connects a display unit to a driving circuit unit), and store intrinsic information (e.g., item name or product specification) about a mobile item in order to supply product information to the display unit. Here, an organic electroluminescence device or a liquid crystal display may be employed as the display unit.

The display unit may be formed on a glass substrate and be driven by a low voltage or a voltage in an intermediate voltage band of less than 15V. However, a general EEPROM device typically requires a high voltage of 20V and even higher for programming and erasing. Therefore, it may be necessary to change the design of the EEPROM device integrated in the LDI so that the EEPROM device can be driven by a low voltage or an intermediate voltage.

To achieve this change, a technique has been suggested to further install an access transistor and an erase transistor so that an EEPROM device can be programmed (written/read) and erased by a low voltage and an intermediate voltage. Thus, in a conventional EEPROM device, a predetermined voltage may be directly applied to a gate, a source, a drain and a body to perform programming and erasing, but a high voltage should be applied to the body when erasing. Meanwhile, an access transistor and an erase transistor, driven by an intermediate voltage and a low voltage, respectively are electrically connected to the EEPROM device, and thus programming (writing/reading) and erasing can be performed without directly supplying a high voltage to the EEPROM device. Accordingly, the EEPROM can be driven by the voltage(s) used in the LDI.

The foregoing conventional non-volatile memory device will be described with reference to FIGS. 1 and 2. FIG. 1 is a plan view of a non-volatile memory device integrated in a conventional LDI, and FIG. 2 is a sectional view of the non-volatile memory device of FIG. 1 taken along a line II-II' of FIG. 1.

Referring to FIGS. 1 and 2, a first n-well 15a and a second n-well 15b are formed within a semiconductor substrate 10. The first n-well 15a is a region where an EEPROM device ($E^2$RPOM) and an access transistor AT will be formed. The second n-well 15b is a region where an erase transistor ET will be formed. The second n-well 15b, where the erase transistor ET will be formed, should be supplied with an intermediate voltage (of about 12V) when operating the erase transistor ET. Therefore, in order to exclude an electrical influence upon the first n-well 15a by the voltage applied to the second n-well 15b, the first and second n-wells 15a and 15b should be spaced apart from each other by a predetermined distance S. If the first n-well 15a and the second n-well 15b are not separated or are adjacently disposed, punch-through may occur in the access transistor AT due to an influence of the voltage on the second n-well 15b when the intermediate voltage is supplied to a body (i.e., the second n-well 15b) of the erase transistor ET to erase data. Accordingly, the first n-well 15a and the second n-well 15b may be spaced apart from each other by the distance S (e.g., 10~15 µm, so as not to be significantly affected by mutual voltages.

In order to form an NMOS-type access transistor AT in a predetermined portion of the first n-well 15a, a pocket p-well 20 is formed. Device isolating layers 25 are formed in the first n-well 15a including the pocket p-well 20 and the second n-well 15b to define an active region where an access transistor region, an erase transistor region and a body contact region are substantially formed.

A floating gate 35 is formed on the first n-well 15a. The floating gate 35 extends over the first n-well 15a and the second n-well 15b to be a gate (hereinafter referred to as access gate 35a) of the access transistor AT and a gate (hereinafter referred to as erase gate 35b) of the erase transistor ET. In other words, the access gate 35a and the erase gate 35b are disposed to one side of the floating gate 35. A lower gate consisting of the floating gate 35, the access gate 35a and the erase gate 35b is electrically floated. Also, a gate insulating layer 30 is interposed between the floating gate 35 and the substrate 10. A control gate 45 is formed on an upper surface of the floating gate 35, and an inter-gate insulating layer 40 is interposed between the floating gate 35 and the control gate 45.

N-type source/drain regions 50 are formed in the active region on both sides of the access gate 35a, and p-type source/drain regions 60 are formed in the active region on both sides of the erase gate 35b. The n-type source/drain regions 50 and the p-type source/drain regions 60 are illustrated as being disposed under the access gate 35a and the erase gate 35b in FIG. 2, but, substantially, are mostly hidden by being disposed in the active region on both sides of the access gate 30b and the erase gate 30c. Therefore, they are denoted by dotted lines.

When forming the n-type source/drain regions 50, a body contact region B1 of the first n-well 15a and a body contact region B2 of the second n-well 15b are formed. Additionally, a body contact region B3 of the pocket p-well 20 is formed when forming the p-type source/drain regions 60. Here, a reference numeral C1 denotes a contact of the control gate, C2 denotes a contact of the access transistor AT, and C3 denotes a contact of the erase gate 35b.

Because the sizes of mobile devices are continually being reduced, an area occupied by the LDI and an area of a non-volatile memory device integrated in the LDI installed in the mobile devices must be decreased. However, the size of the EEPROM ($E^2$PROM) is directly related to its storage capacity and a width of the access transistor AT and a width of the erase transistor ET are formed with minimum feature sizes.

Therefore, it may be difficult to shrink the size of the EEPROM without reducing storage capacity. Moreover, since the first and second n-wells 15a and 15b are spaced apart from each other by a predetermined distance S, which is the minimum distance required, to prevent punchthrough, it is difficult to decrease the distance S. Consequently, it may be difficult to decrease the area of the non-volatile memory device to meet a need for higher integration of the LDI.

SUMMARY OF THE INVENTION

Non-volatile memory devices according to embodiments of the present invention include an EEPROM transistor in a first portion of a semiconductor substrate, an access transistor in a second portion of the semiconductor substrate and an erase transistor in a third portion of the semiconductor substrate. The second portion of the semiconductor substrate extends adjacent a first side of the first portion of the semiconductor substrate and the third portion of the semiconductor substrate extends adjacent a second side of the first portion of the semiconductor substrate. The first and second sides of the first portion of the semiconductor substrate may be opposite sides of the first portion of the semiconductor substrate. Moreover, the access transistor has a first source/drain terminal electrically connected to a first source/drain terminal of the EEPROM transistor and the erase transistor has a first source/drain terminal electrically connected to a second source/drain terminal of the access transistor.

According to additional aspects of these embodiments, the first portion of the semiconductor substrate includes a device isolating layer (e.g., trench isolation layer) extending adjacent a surface of the semiconductor substrate. In addition, the EEPROM transistor may include a tunnel insulating layer on the device isolating layer, a floating gate electrode on the tunnel insulating layer, an inter-gate insulating layer on the floating gate electrode and a control gate electrode on the inter-gate insulating layer. The second portion of the semiconductor substrate includes a first semiconductor well region of first conductivity type and a pocket well region of second conductivity type in the first semiconductor well region. The access transistor includes a first gate insulating layer on a portion of the pocket well region and an access gate electrode on the first gate insulating layer. The access gate electrode is electrically connected to the floating gate electrode. The third portion of the semiconductor substrate includes a second semiconductor well region of first conductivity type. The erase transistor includes a second gate insulating layer on a portion of the second semiconductor well region and an erase gate electrode on the second gate insulating layer. The erase gate electrode is electrically connected to the floating gate electrode. In particular, the access gate electrode, erase gate electrode and floating gate electrode may be formed of the same material layer (e.g., electrically conductive layer) that can be patterned to define these three electrodes.

According to additional embodiments of the invention, a non-volatile memory device is provided that includes a semiconductor substrate having first and second N-type semiconductor well regions therein. These well regions are spaced apart from each other. The first N-type semiconductor well region has a pocket P-type semiconductor well region therein. A device isolating layer is provided in a portion of the semiconductor substrate extending between the first and second N-type semiconductor well regions. A patterned electrically conductive layer is also provided. The electrically conductive layer includes a floating gate electrode extending opposite a portion of the device isolating layer, an access gate electrode extending opposite the first N-type semiconductor well region and an erase gate electrode extending opposite the second N-type semiconductor well region. A control gate electrode is provided, which extends opposite the floating gate electrode. In addition, the access gate electrode extends opposite a portion of the pocket P-type semiconductor well region. This pocket P-type semiconductor well region includes N-type source and drain regions therein on opposite sides of the access gate electrode.

According to further aspects of these embodiments, the second N-type semiconductor well region includes P-type source and drain regions therein on opposite sides of the erase gate electrode. The first and second N-type semiconductor well regions may also be spaced from each other by a first distance in a range from about 10 um to about 15 um. A P-type impurity region is also provided, which extends in the semiconductor substrate, at a location underneath the device isolating layer. This P-type impurity region forms P-N rectifying junctions with the first and second N-type semiconductor well regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
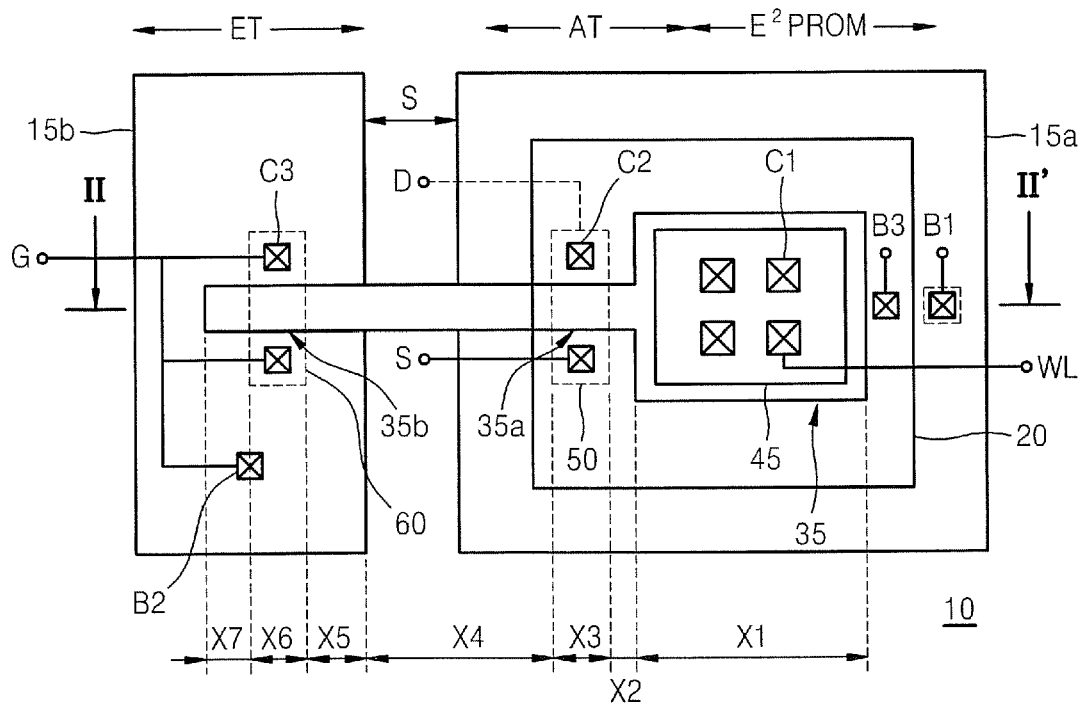
FIG. 1 is a plan view of a non-volatile memory device integrated in a conventional LCD drive IC (LDI)
Figure 2:
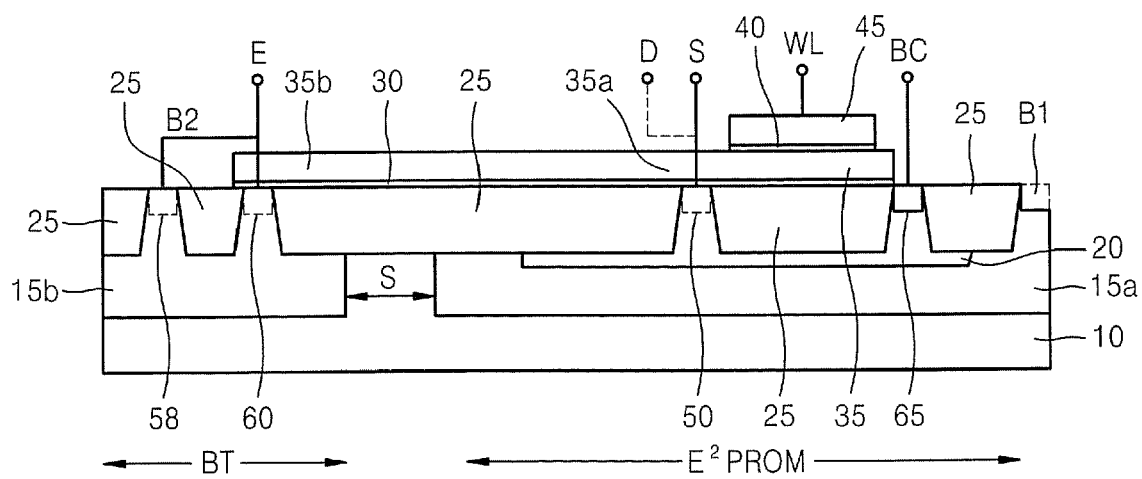
FIG. 2 is a sectional view of the non-volatile memory device of FIG. 1 taken along a line II-II' of FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

According to an embodiment of the present invention, an EEPROM device including a floating gate is disposed in a space between an access transistor region and an erase transistor region that are spaced apart from each other by a predetermined distance so as to prevent an electrical influence thereon. By doing so, an area where the EEPROM must be formed can be decreased.

Figure 3:
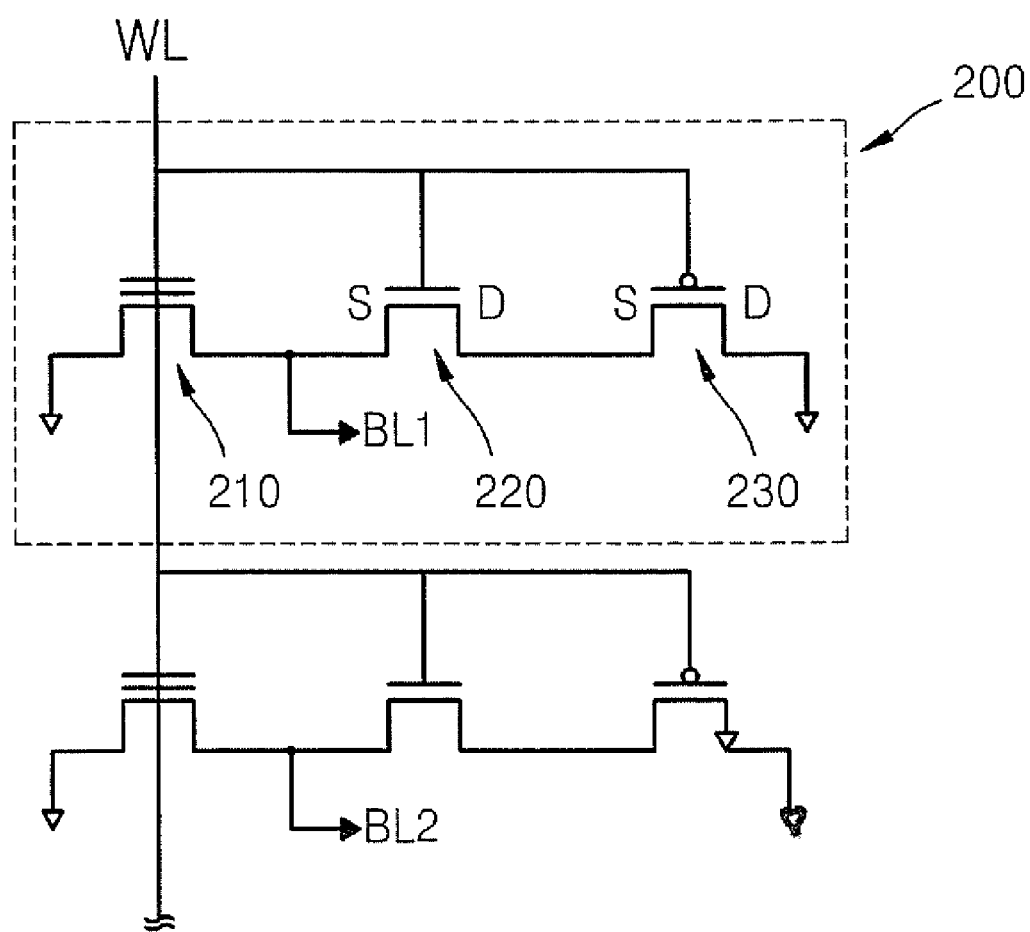
FIG. 3 is a circuit diagram of a non-volatile memory device integrated in an LDI, according to an embodiment of the present invention.

FIG. 3 is a circuit diagram illustrating a non-volatile memory device integrated in an LDI according to an embodiment of the present invention. Referring to FIG. 3, a unit cell 200 of the non-volatile memory device integrated in the LDI includes an EEPROM 210 having a floating gate, an access transistor 220 and an erase transistor 230, connected as illustrated. A source of the access transistor 220 is connected to a drain of the EEPROM 210, and a source of the erase transistor 230 is connected to a drain of the access transistor 220. The source of the access transistor 220 and the drain of the EEPROM 210 are supplied with a bit line signal BL.

When data is written/read to/from the EEPROM 210, a suitable voltage is supplied to a gate and the drain of the access transistor 220. When the data is erased from the EEPROM 210, a suitable voltage is supplied to the source, a drain and a body of the erase transistor 230.

Figure 4:
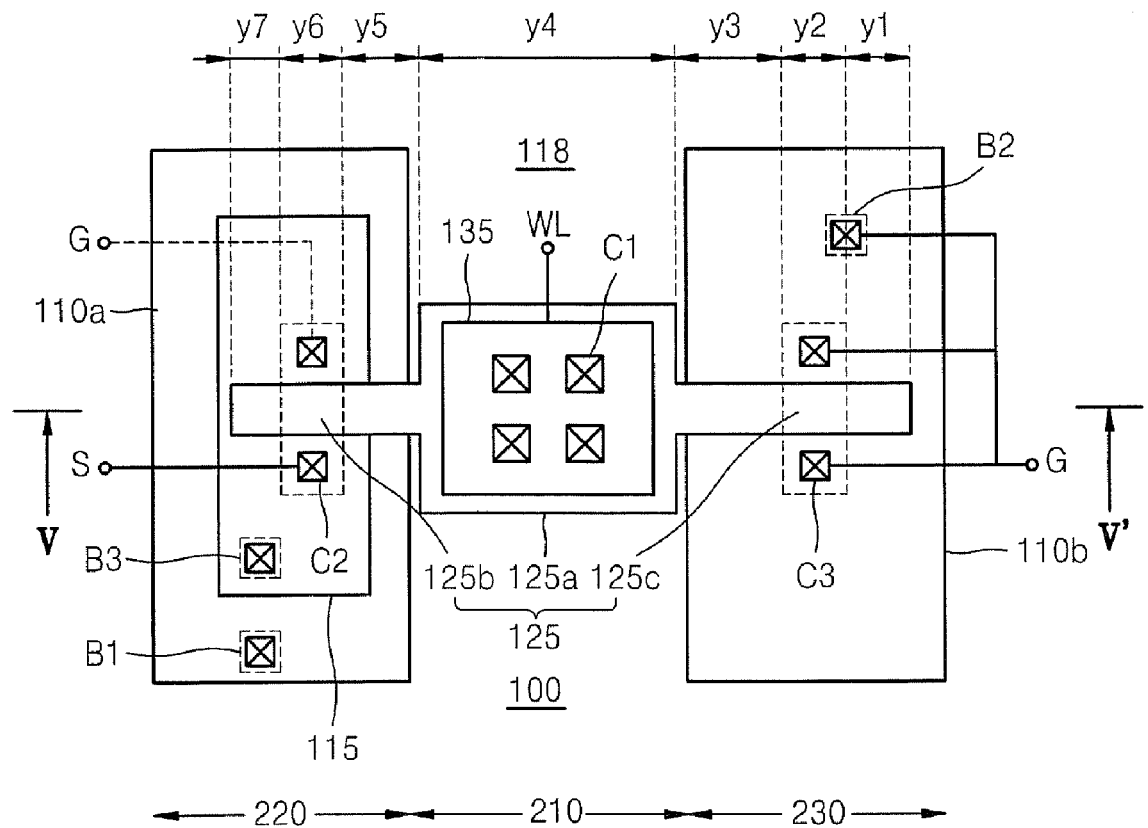
FIG. 4 is a plan view of the non-volatile memory device of FIG. 3 integrated in the LDI, according to an embodiment of the present invention.
Figure 5:
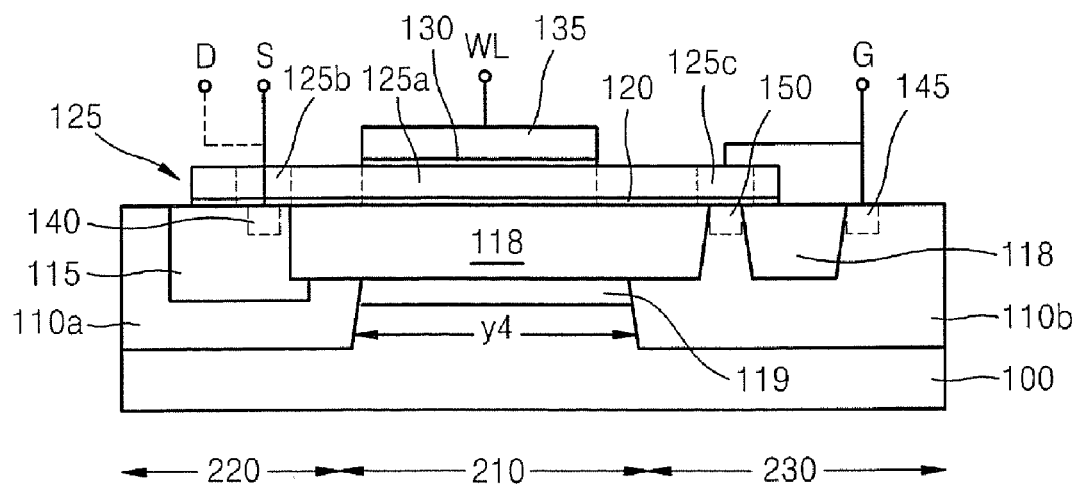
FIG. 5 is a sectional view of the non-volatile memory device of FIG. 4 taken along a line V-V' of FIG. 4.

The non-volatile memory device integrated in the LDI according to the current embodiment of the present invention illustrated in FIG. 3 is arranged in a semiconductor substrate 100 as shown in FIGS. 4 and 5. FIG. 4 is a plan view of the non-volatile memory device of FIG. 3 integrated in the LDI according to an embodiment of the present invention, and FIG. 5 is a sectional view of the non-volatile memory device of FIG. 4 taken along a line V-V' of FIG. 4.

Referring to FIGS. 4 and 5, a first n-well 110a where the access transistor 220 will be formed, and a second n-well 110b where the erase transistor 230 will be formed are disposed in the semiconductor substrate 100 to be spaced apart by a predetermined distance y4. The first n-well 110a and the second n-well 110b are spaced apart from each other by the distance y4, so as to be unaffected by respectively-applied voltages. For example, the first n-well 110a and the second n-well 110b may be spaced apart from each other by approximately 10~15 μm.

In order to form the N-type access transistor 220 within the first n-well 110a, a pocket p-well 115 is provided. Also, a device isolating layer 118 is formed in the semiconductor substrate 100 to form an active region where the N-type access transistor 220, the erase transistor 230 and a body contact region will be formed. The pocket p-well 115 may be shallower than the first n-well 110a, and the device isolating layer 118 may be shallower than the pocket p-well 115. A p-type impurity region 119 may be formed under the device isolating layer 118 between the first n-well 110a and the second n-well 110b to improve a property of a breakdown voltage of the transistor.

A lower gate 125 including a floating gate 125a, an access gate 125b and an erase gate 125c, wherein the access gate 125b and the erase gate 125c extend from the floating gate 125a, is formed on the semiconductor substrate 100 where the device isolating layer 118 is formed. The floating gate 125a is disposed between the first and second n-wells 110a and 110b. The access gate 125b extends from one side of the floating gate 125a toward the first n-well 110a. The erase gate 125c extends from the other side of the floating gate 125a toward the second n-well 110b. Since driving of the floating gate 125a is unaffected by an electrical state of an underlying layer (or substrate), there is no problem relating to the draining of charge from the floating gate 125a even though the floating gate 125a is formed on the device isolating layer 118 between the first n-well 110a and the second n-well 110b. Also, because the first n-well 110a and the second n-well 110b are formed to be spaced apart from each other to prevent punch-through regardless of a packing density of the LDI, a cell size as wide as the floating gate 125a can be decreased by using a region on the device isolating layer 118 as the floating gate 125a region. According to the current embodiment of the present invention, the lower gate 125 is composed of doped polysilicon but the present invention is not defined thereto, another conductive material such as metal may be used.

A gate insulating layer 120 is interposed between the substrate and the lower gate 125 including the floating gate 125a, the access gate 125b and the erase gate 125c. Additionally, a control gate 135 is disposed on the floating gate 125a, and an inter-gate insulating layer 130 is interposed therebetween. The control gate 135 is supplied with a signal from a word line WL.

N-type source/drain regions 140 are formed in the active region on both sides of the access gate 125b. Simultaneously, a first body contact region B1 providing a body bias voltage to the first n-well 110a, and a second body contact region B2 providing the body bias voltage to the second n-well 110b are respectively formed in the first n-well 110a and the second n-well 110b. P-type source/drain regions 150 are formed in the active region on both sides of the erase gate 125c. At the same time, a third body contact region B3 to supply a bias voltage to the pocket p-well 115 is formed within the pocket p-well 115. Alternatively, low-density impurity regions having the same impurity type as that of the active region may be respectively formed in the active region (i.e., a pre-channel region of the N-type access transistor 220) overlapping the access gate 125b and the active region (i.e., a channel region of the erase transistor 230) overlapping the erase gate 125c, thereby improving a breakdown voltage of the transistor.

Dot-lined regions 140, 145 and 150 in FIG. 5 are not placed on the cutaway section, but are hidden on the surface of the substrate 100. A reference numeral C1 denotes a control gate contact, C2 denotes source/drain contacts of the N-type access transistor 220, and C3 denotes source/drain contacts of the erase transistor 230.

In the current embodiment of the present invention, the floating gate 125a of the EEPROM device is located between the first n-well 110a where the access transistor 230 will be formed and the second n-well 110b where the erase gate 125c will be formed. In this case, since the first and second n-wells 110a and 110b are to be spaced apart from each other by a predetermined distance to prevent punchthrough, the space between the first and second n-wells 110a and 110b is used as the floating gate 125a region. By doing so, the area of the EEPROM device is reduced to at least the size of the area of the floating gate 125a.

The following Table 1 displays lengths for respective portions of the lower gate 125 (refer to FIG. 4) formed according to an embodiment of the present invention.

TABLE 1

| | |
|---|---|
| y1 (length from one end of the lower gate to the erase gate) | about 1 μm |
| y2 (erase gate) | about 0.5~1 μm |
| y3 (distance between the erase gate and the $2^{nd}$ n-well) | about 1 μm |
| y4 (distance between the $1^{st}$ n-well and the $2^{nd}$ n-well) | about 10 μm |
| y5 (distance between the floating gate to the erase gate) | about 1 μm |
| y6 (length of the access gate) | about 0.5~1 μm |
| y7 (distance from the access gate to the other end of the lower gate) | about 1 μm |
| Total length of the lower gate | about 15~16 μm |

Table 2 displays the lengths of respective portions of the lower gate 30 (of the non-volatile memory device illustrated in FIG. 1) formed using a conventional technique.

TABLE 2

| | |
|---|---|
| x1 (length of the floating gate) | about $\sqrt{10}$~$\sqrt{20}$ |
| x2 (distance from the floating gate to the access gate) | about 1 μm |
| x3 (length of the access gate) | about 0.5~1 μm |
| x4 (length from the access gate to the $2^{nd}$ n-well) | about 15~20 μm |
| x5 (distance from the $2^{nd}$ n-well to the erase gate) | about 1 μm |
| x6 (length of the erase gate) | about 0.5~1 μm |
| x7 (distance from the erase gate to the end of the lower gate) | 1 μm |
| Total length of the lower gate | about 22~30 μm |

According to Table 1 and Table 2, the total length of the lower gate 125 according to the present invention is shorter than that of the conventional lower gate 35 by about 6~15 μm. As described above, the lower gate 125 of the EEPROM device of the present invention represents a unit cell size of the EEPROM device. Accordingly, by placing the floating gate between the first n-well 110a and the second n-well, the unit cell area of the EEPROM can be greatly decreased. In the current embodiment of the present invention, although the erase transistor 230 is located on the right side and the N-type access transistor 230 is located on the left side of the floating gate 125a, these locations may be changed.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A non-volatile memory device, comprising:
an EEPROM transistor in a first portion of a semiconductor substrate, said EEPROM transistor comprising a control gate electrode;
an access transistor in a second portion of the semiconductor substrate that extends adjacent a first side of the first portion of the semiconductor substrate, said access transistor having a first source/drain terminal electrically connected to a first source/drain terminal of said EEPROM transistor and an active region that forms a first P-N junction in the second portion of the semiconductor substrate; and
an erase transistor in a third portion of the semiconductor substrate that extends adjacent a second side of the first portion of the semiconductor substrate, said erase transistor having a first source/drain terminal electrically connected to a second source/drain terminal of said access transistor and an active region that forms a second P-N junction in the third portion of the semiconductor substrate;
wherein the first portion of the semiconductor substrate extends between the first and second P-N junctions; and
wherein the second and third portions of the semiconductor substrate extend on diametrically opposite sides of the control gate electrode.

2. The device of claim 1, wherein the first and second sides of the first portion of the semiconductor substrate are opposite sides of the first portion of the semiconductor substrate.

3. The device of claim 2, wherein the first portion of the semiconductor substrate comprises a device isolating layer extending adjacent a surface of the semiconductor substrate; and wherein said EEPROM transistor comprises a tunnel insulating layer on the device isolating layer, a floating gate electrode on the tunnel insulating layer, and an inter-gate insulating layer on the floating gate electrode.

4. The device of claim 3, wherein the second portion of the semiconductor substrate comprises a first semiconductor well region of first conductivity type and a pocket well region of second conductivity type in said first semiconductor well region; and wherein said access transistor comprises a first gate insulating layer on a portion of the pocket well region and an access gate electrode on the first gate insulating layer, said access gate electrode electrically connected to the floating gate electrode.

5. The device of claim 4, wherein the second portion of the semiconductor substrate further comprises first and second body contacts on the first semiconductor well region of first conductivity type and the pocket well region of second conductivity type, respectively.

6. The device of claim 3, wherein the third portion of the semiconductor substrate comprises a second semiconductor well region of first conductivity type; and wherein said erase transistor comprises a second gate insulating layer on a portion of the second semiconductor well region and an erase gate electrode on the second gate insulating layer, said erase gate electrode electrically connected to the floating gate electrode.

7. The device of claim 4, wherein the third portion of the semiconductor substrate comprises a second semiconductor well region of first conductivity type; and wherein said erase transistor comprises a second gate insulating layer on a portion of the second semiconductor well region and an erase gate electrode on the second gate insulating layer, said erase gate electrode electrically connected to the floating gate electrode.

8. The device of claim 7, wherein said access gate electrode extends from a first side of the floating gate electrode and said erase gate electrode extends from a second side of the floating gate electrode; and wherein the first and second sides of the floating gate electrode are opposite sides of the floating gate electrode.

* * * * *